(12) United States Patent
Fenner et al.

(10) Patent No.: US 10,818,811 B2
(45) Date of Patent: Oct. 27, 2020

(54) POWER SOURCE AND METHOD OF FORMING SAME

(71) Applicant: Medtronic, Inc., Minneapolis, MN (US)

(72) Inventors: Andreas A. Fenner, Chandler, AZ (US); David A. Ruben, Mesa, AZ (US); Jennifer Lorenz Marckmann, Scottsdale, AZ (US); James R. Wasson, Tempe, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 16/409,956

(22) Filed: May 13, 2019

(65) Prior Publication Data

US 2019/0267503 A1    Aug. 29, 2019

Related U.S. Application Data

(63) Continuation of application No. 15/252,398, filed on Aug. 31, 2016, now Pat. No. 10,290,757.

(Continued)

(51) Int. Cl.
*H01L 31/055* (2014.01)
*H01L 31/16* (2006.01)
(Continued)

(52) U.S. Cl.
CPC ............ *H01L 31/055* (2013.01); *G21H 1/12* (2013.01); *H01L 31/0547* (2014.12); *H01L 31/165* (2013.01); *Y02E 10/52* (2013.01)

(58) Field of Classification Search
CPC . H01L 31/055; H01L 31/0547; H01L 31/054; G21H 1/12
See application file for complete search history.

(56) References Cited

U.S. PATENT DOCUMENTS 4,855,879 A    8/1989  Soltani et al.
5,721,462 A    2/1998  Shanks
(Continued)

FOREIGN PATENT DOCUMENTS

GB       638106       5/1950
WO    9007797 A1     7/1990
(Continued)

OTHER PUBLICATIONS

Califano et al., "Efficient inverse Auger recombination at threshold in CdSe nanocrystals," Nano Letters, 2004; 4 (3):525-531.
(Continued)

*Primary Examiner* — Susan D Leong
(74) *Attorney, Agent, or Firm* — Mueting Raasch Group

(57) ABSTRACT

Various embodiments of a power source and method of forming such power source are disclosed. The power source can include a substrate and a cavity disposed in a first major surface of the substrate. The power source can also include radioactive material disposed within the cavity, where the radioactive material emits radiation particles; and particle converting material disposed within the cavity, where the particle converting material converts one or more radiation particles emitted by the radioactive material into light. The power source further includes a sealing layer disposed such that the particle converting material and the radioactive material are hermetically sealed within the cavity, and a photovoltaic device disposed adjacent the substrate. The photovoltaic device can convert at least a portion of the light emitted by the particle converting material that is incident upon an input surface of the photovoltaic device into electrical energy.

19 Claims, 7 Drawing Sheets

Related U.S. Application Data

(60) Provisional application No. 62/215,806, filed on Sep. 9, 2015.

(51) Int. Cl.
   *H01L 31/054* (2014.01)
   *G21H 1/12* (2006.01)

(56) References Cited

U.S. PATENT DOCUMENTS

| | | | |
|---|---|---|---|
| 6,304,766 | B1 | 10/2001 | Colvin, Jr. |
| 8,134,275 | B2 | 3/2012 | Kavetsky et al. |
| 9,466,401 | B1 * | 10/2016 | Cabauy ............... H01L 31/115 |
| 10,290,757 | B2 * | 5/2019 | Fenner ................. H01L 31/055 |
| 2005/0231064 | A1 | 10/2005 | Raffaelle et al. |
| 2006/0021647 | A1 | 2/2006 | Gui et al. |
| 2007/0099359 | A1 | 5/2007 | Klimov et al. |
| 2008/0314435 | A1 | 12/2008 | He |
| 2009/0026879 | A1 | 1/2009 | Prelas |
| 2010/0051102 | A1 * | 3/2010 | Lin ..................... H01L 31/052 136/259 |
| 2011/0100439 | A1 | 5/2011 | Clothier et al. |
| 2011/0152321 | A1 | 6/2011 | Lawson et al. |
| 2011/0291210 | A1 | 12/2011 | Batchelder |
| 2012/0081013 | A1 | 4/2012 | Frazier et al. |
| 2012/0126298 | A1 * | 5/2012 | Chen ................... H01L 27/0688 257/290 |
| 2012/0145532 | A1 | 6/2012 | Smolyakov et al. |
| 2012/0161575 | A1 | 6/2012 | Choi et al. |
| 2012/0186637 | A1 | 7/2012 | Batchelder |
| 2013/0015059 | A1 | 1/2013 | Haryu et al. |
| 2013/0049018 | A1 * | 2/2013 | Ramer ................. H01L 31/052 257/81 |
| 2013/0098440 | A1 | 4/2013 | Hodes et al. |
| 2013/0264907 | A1 | 10/2013 | Lee et al. |
| 2013/0298980 | A1 * | 11/2013 | Fogel ................... H01L 31/046 136/256 |
| 2014/0021827 | A1 * | 1/2014 | Noyes .................. G21H 1/06 310/303 |
| 2014/0022818 | A1 | 1/2014 | Natsumeda et al. |
| 2014/0261612 | A1 * | 9/2014 | Smith ............. H01L 31/035281 136/244 |
| 2015/0279491 | A1 | 10/2015 | Fenner et al. |
| 2015/0311444 | A9 * | 10/2015 | Barr .................... H01L 51/0021 136/256 |
| 2015/0369433 | A1 * | 12/2015 | Chen .................. G02F 1/133502 362/157 |

FOREIGN PATENT DOCUMENTS

| | | | |
|---|---|---|---|
| WO | WO-2007002110 A2 * | 1/2007 | ......... H01L 31/0547 |
| WO | 2009103974 A1 | 8/2009 | |
| WO | 2011089611 A1 | 7/2011 | |
| WO | 20111125024 A1 | 10/2011 | |
| WO | 2014191718 A1 | 12/2014 | |
| WO | 2015153187 A1 | 10/2015 | |

OTHER PUBLICATIONS

Jasim, "Dye Sensitized Solar Cells—Working Principles, Challenges and Opportunities," Chapter 8 in Solar Cells—Dye Sensitized Devices. Kosyachenko (Ed.). Published by InTech. 2011.

McDaniel et al., "An integrated approach to realizing high-performance liquid-junction quantum dot sensitized solar cells," Nature Communications, Dec. 10, 2013; 4:2887.

Mora-Seró et al., "Recombination in Quantum Dot Sensitized Solar Cells," Accounts of Chemical Research, 2009; 42 (11):1848-1857.

Polymers, Phosphors, and Voltaics for Radioisotope Microbatteries, Bower et al. (Eds). CRC Press, Taylor & Francis Group, Boca Raton, FL. 2002. pp. 20-36.

Sims et al., "High Efficiency GaP Power Conversion for Betavoltaic Applications," Proceedings Paper published in the Proceedings of the 13th Space Photovoltaic Research and Technology Conference (SPRAT 13), Sep 1, 1994. pp. 373-382.

Xu et al., "Development of a beta radioluminescence nuclear battery," Nuclear Science and Technique, 2014; 25:040603.

PCT Notification of Transmittal of the International Search Report and Written Opinion dated Sep. 15, 2015 9 pages.

Würfel et al., "Charge Carrier Separation in Solar Cells", IEEE Journal of Photovoltaics, vol. 5, No. 1, Jan. 2015, 9 pages.

PCT Notification of Transmittal of the International Search Report and the Written Opinion of the International Searching Authority, dated Dec. 1, 2016, 11 pages.

* cited by examiner

POWER SOURCE AND METHOD OF FORMING SAME

CROSS-REFERENCE TO RELATED APPLICATIONS

This application is a Continuation of U.S. application Ser. No. 15/252,398, filed Aug. 31, 2016, now U.S. Pat. No. 10,290,757, and claims the benefit of U.S. Provisional Application No. 62/215,806, filed on Sep. 9, 2015, the entire contents of which are hereby incorporated by reference.

BACKGROUND

Power sources such as radiation particle power converters can convert energy from a radioactive source that emits high-energy electrons, e.g., beta particles, into electrical energy. The power converter can directly convert the energy of the high-energy electrons to electrical energy, i.e., current, by collecting electron-hole pairs that are formed by the high-energy electrons that are incident upon a semiconductor material of the power converter.

One such direct power source includes a radiation-emitting radioisotope and a plurality of semiconductor substrates. Each of the plurality of semiconductor substrates includes a junction for converting radiation particles to electrical energy, e.g., a p-n junction. The junction collects electron-hole pairs that are created within the semiconductor material as a result of interaction with the nuclear radiation particles. Specifically, when a radiation particle of sufficient energy impacts the semiconductor material, electrons in the semiconductor material are excited into a conduction band of the semiconductor material, thereby creating electron-hole pairs. Electrons formed on an n side of a p-n junction are generally prevented from crossing the p-n junction due to the electric field that is created in a depletion zone, while the corresponding holes are swept across the p-n junction by the electric field. Electrons formed on the p side of the p-n junction are swept across the junction by the electric field while the corresponding holes are prevented from crossing the junction by the electric field. When the semiconductor material is connected to a load, electrons formed on the n side of the junction are swept across the junction from the p side via an anode and through a circuit connected to the power converter. The electrons that flow through the circuit then flow into the p side via a cathode, where they can recombine with holes from the original electron-hole pairs.

Other types of power sources that utilize radiation particles indirectly convert the particles by utilizing a phosphor layer placed adjacent the radiation particle source. The phosphor absorbs the energy of the radiation particles and emits visible or invisible light, which is absorbed and converted into electricity by a photovoltaic device. While such indirect power sources may initially be less efficient than direct power sources, over time such indirect power sources have a higher efficiency and longer service life than that of at least some of the direct power sources.

SUMMARY

In general, the present disclosure provides various embodiments of a power source and a method of forming such power source. In one or more embodiments, the power source can include a substrate having a structured surface. Radioactive material, which is adapted to emit radiation particles, can be disposed within one or more structures of the structured surface. Particle converting material, which is adapted to convert one or more of the radiation particles emitted by the radioactive material into electromagnetic radiation, can also be disposed within one or more structures of the structured surface. A photovoltaic device disposed adjacent the substrate can convert at least a portion of the electromagnetic radiation emitted by the particle converting material into electrical energy.

In one aspect, the present disclosure provides one embodiment of a power source. The power source includes a substrate that includes a first major surface and a second major surface, and a cavity disposed in the first major surface, where the cavity includes a sidewall. The power source also includes radioactive material disposed within the cavity, where the radioactive material emits radiation particles; and particle converting material disposed within the cavity, where the particle converting material converts one or more radiation particles emitted by the radioactive material into light. The power source further includes a sealing layer disposed such that the particle converting material and the radioactive material are hermetically sealed within the cavity, and a photovoltaic device disposed adjacent the substrate. The photovoltaic device converts at least a portion of the light emitted by the particle converting material that is incident upon an input surface of the photovoltaic device into electrical energy.

In another aspect, the present disclosure provides another embodiment of a power source. The power source includes a light guide that extends along a light guide axis between a first end and a second end of the light guide, where the light guide includes an outer surface that extends between the first end and the second end, and an emitting surface at the first end. The power source further includes radioactive material disposed within the light guide along the light guide axis, where the radioactive material emits radiation particles. The power source further includes a particle converting material disposed within the light guide along the light guide axis between at least a portion of the radioactive material and the outer surface of the light guide, where the particle converting material converts one or more radiation particles emitted by the radioactive material into light. Further, the power source includes a photovoltaic device disposed adjacent the emitting surface of the light guide, where the photovoltaic device converts at least a portion of the light emitted by the particle converting material that is incident upon an input surface of the photovoltaic device into electrical energy.

In another aspect, the present disclosure provides one embodiment of a method of forming a power source. The method includes disposing a cavity in a first major surface of a substrate, where the substrate also includes a second major surface; disposing radioactive material within the cavity, where the radioactive material emits radiation particles; and disposing particle converting material within the cavity, where the particle converting material converts one or more radiation particles emitted by the radioactive material into light. The method further includes disposing a sealing layer over the cavity such that the radioactive material and the particle converting material are hermetically sealed within the cavity; and converting at least a portion of the light emitted by the particle converting material into electrical energy.

All headings provided herein are for the convenience of the reader and should not be used to limit the meaning of any text that follows the heading, unless so specified.

The terms "comprises" and variations thereof do not have a limiting meaning where these terms appear in the description and claims. Such terms will be understood to imply the inclusion of a stated step or element or group of steps or elements but not the exclusion of any other step or element or group of steps or elements.

The words "preferred" and "preferably" refer to embodiments of the disclosure that may afford certain benefits, under certain circumstances; however, other embodiments may also be preferred, under the same or other circumstances. Furthermore, the recitation of one or more preferred embodiments does not imply that other embodiments are not useful, and is not intended to exclude other embodiments from the scope of the disclosure.

In this application, terms such as "a," "an," and "the" are not intended to refer to only a singular entity, but include the general class of which a specific example may be used for illustration. The terms "a," "an," and "the" are used interchangeably with the term "at least one." The phrases "at least one of" and "comprises at least one of" followed by a list refers to any one of the items in the list and any combination of two or more items in the list.

The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

As used herein in connection with a measured quantity, the term "about" refers to that variation in the measured quantity as would be expected by the skilled artisan making the measurement and exercising a level of care commensurate with the objective of the measurement and the precision of the measuring equipment used. Herein, "up to" a number (e.g., up to 50) includes the number (e.g., 50).

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

These and other aspects of the present disclosure will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

Throughout the specification, reference is made to the appended drawings, where like reference numerals designate like elements, and wherein.

DETAILED DESCRIPTION

Figure 1:
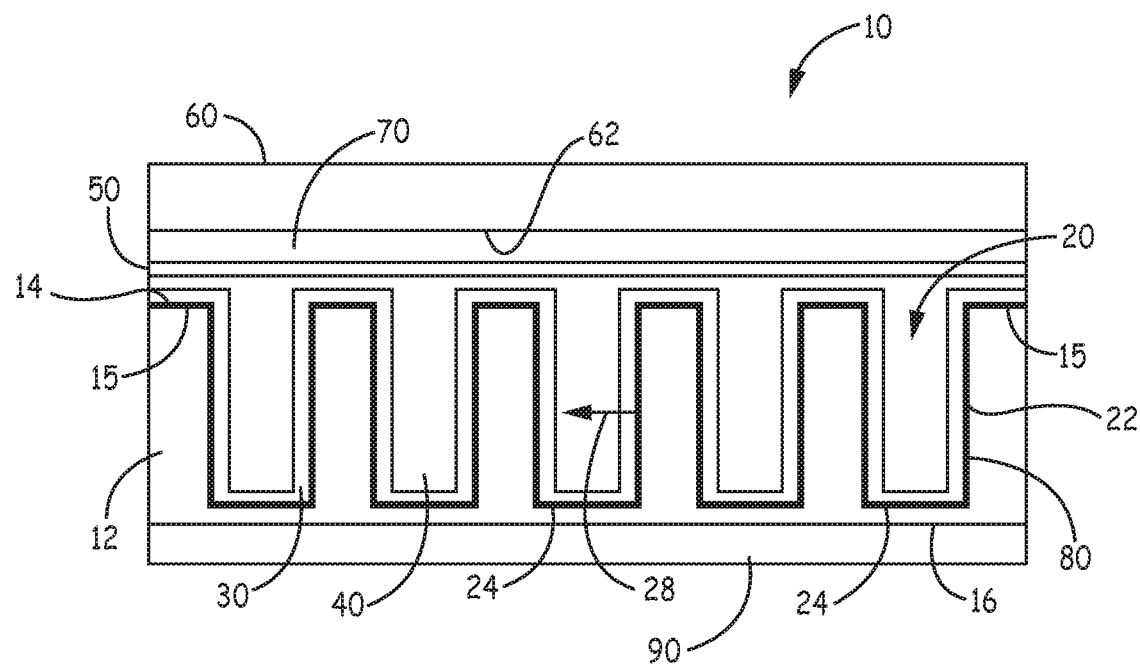
FIG. 1 is a schematic cross-section view of one embodiment of a power source.

In general, the present disclosure provides various embodiments of a power source and a method of forming such power source. In one or more embodiments, the power source can include a substrate having a structured surface. Radioactive material, which is adapted to emit radiation particles, can be disposed within one or more structures of the structured surface. Particle converting material, which is adapted to convert one or more of the radiation particles emitted by the radioactive material into electromagnetic radiation, can also be disposed within one or more structures of the structured surface. A photovoltaic device disposed adjacent the substrate can convert at least a portion of the electromagnetic radiation emitted by the particle converting material into electrical energy.

In one or more embodiments, the power source can utilize a two-step process of converting radiation particles to electrical energy. For example, beta energy released by a radioactive material can be converted to electromagnetic radiation, e.g., light. The electromagnetic radiation can then be converted into electrical energy (e.g., electrical current) using, e.g., a photovoltaic device. In general, a radioactive material can be hermetically enclosed or sealed in a substrate or enclosure. A radiation particle converting material, e.g., phosphor, can be disposed within or adjacent the substrate or enclosure. The particle converting material can be excited by the radiation particles emitted by the radioactive material. In one or more embodiments, the enclosed substrate can be transparent to one or more wavelengths of the electromagnetic energy emitted by the particle converting material. Such energy can be incident upon an input surface of the photovoltaic device, where the device can be adapted to convert the electromagnetic radiation emitted by the particle converting material into electrical energy. The device can convert the electromagnetic radiation to electrical energy using any suitable technique or combination of techniques.

One advantage of one or more of the embodiments of a power source described herein is that the conversion of radiation particles to electromagnetic radiation can provide high conversion efficiencies. Another advantage of one or more of the embodiments described herein is that the power source can allow for high volumetric conversion efficiency at a low cost. Further, one or more embodiments of power sources described herein can have a longevity that is equal to or longer than currently-available batteries.

The various embodiments of power sources described herein can be utilized with any suitable device or system. For example, in one or more embodiments, one or more of the power sources described herein can be utilized with any suitable implantable medical devices, e.g., electrocardiogram (ECG) monitors, sensors (such as glucose, pressure), implantable pulse generators (IPGs) (e.g., pacemakers), implantable cardioverter defibrillators (ICDs), etc. Further, for example, one or more of the described power sources can be utilized with electronic devices that are external to the human body, e.g., EKG sensors, ECG sensors, oxygen sensors, glucose sensors, hearing aids, etc.

Figure 2:
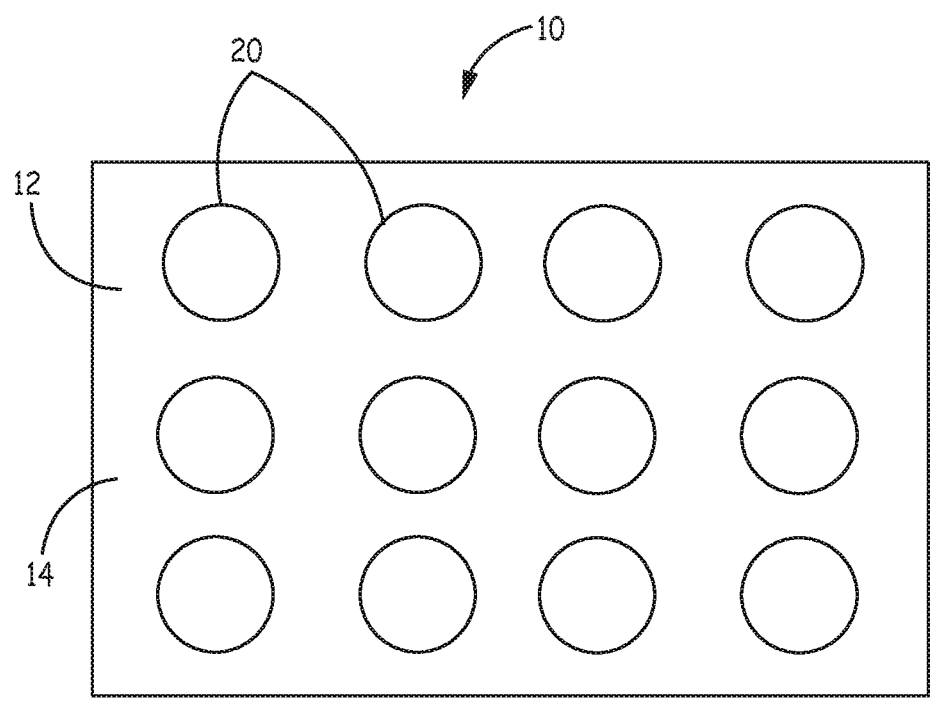
FIG. 2 is a schematic top plan view of the power source of FIG. 1.

FIGS. 1-2 are various views of one embodiment of a power source 10. The power source 10 includes a substrate 12 having a first major surface 14 and a second major surface 16. In one or more embodiments, the substrate 12 can include one or more structured surfaces. As used herein, the term "structured surface" refers to a surface having one or more structures formed on or in the surface. A structured surface can include any suitable structure or combination of structures, e.g., cavities, depressions, protuberances, pyramids, columns, vias, pores, etc. The one or more structures of the structured surface can have any suitable dimensions and take any suitable shape or combination of shapes. For example, a structure of a structured surface can have any suitable cross-sectional shape in a plane parallel to the structured surface, e.g., elliptical, rectilinear, triangular, polygonal. Further, a structure of a structured surface can have any suitable shape in a plane orthogonal to the structured surface, e.g., elliptical, rectilinear, triangular, polygonal. The one or more structures of a structured surface can be arranged in a periodic array on or in the structured surface, a random arrangement on or in the structured surface, or a pseudo-random arrangement on or in the structured surface.

As illustrated in FIG. 1, the first major surface 14 of substrate 12 includes a structured surface having one or more structures 20 formed in the first major surface. One or more of the structures 20 can include a cavity. At least one cavity 20 includes a sidewall 22 that extends from the first major surface 14 to a bottom wall 24.

The power source 10 also includes radioactive material 30 disposed within at least one cavity 20. The radioactive material 30 is adapted to emit one or more radiation particles. Also disposed within at least one cavity 20 is particle converting material 40. The particle converting material 40 is adapted to convert one or more radiation particles emitted by the radioactive material 30 into electromagnetic radiation, e.g., light. A sealing layer 50 can be disposed such that the particle converting material 40 and the radioactive material 30 are disposed between the substrate 12 and the sealing layer. In one or more embodiments, the sealing layer 50 can be disposed such that the particle converting material 40 and the radioactive material 30 are sealed within one or more cavities 20. Further, in one or more embodiments, the sealing layer 50 can be disposed such that the particle converting material 40 and the radioactive material 30 are hermetically sealed within one or more cavities 20.

Further, the power source 10 includes a photovoltaic device 60 disposed adjacent the substrate 12. As used herein, the term "adjacent the substrate" means that the photovoltaic device 60 is disposed in relation to the substrate 12 such that the device can receive at least a portion of the electromagnetic radiation emitted by the particle converting material 40 that is incident upon an input surface 62 of the device. In one or more embodiments, the photovoltaic device 60 is adapted to convert at least a portion of the electromagnetic radiation emitted by the particle converting material 40 that is incident upon the input surface 62 of the device into electrical energy.

The substrate 12 can take any suitable shape or combination of shapes and have any suitable dimensions. In one or more embodiments, the substrate 12 can take a shape such that at least one of the first major surface 14 and the second major surface 16 is a planar surface. In one or more embodiments, the substrate 12 is shaped such that the first major surface 14 and the second major surface 16 are both planar surfaces that are substantially parallel to each other. In one or more embodiments, the substrate 12 can take any other suitable shape or combination of shapes, e.g., cylindrical, one or more parallel plates, microspheres, trenches, pillars, etc.

The substrate 12 can include any suitable material or combination of materials. For example, the substrate 12 can include at least one of glass (BSG, BF, foturan, etc.), sapphire, silicone, gallium nitride (GaN), photo-imageable materials, and semiconductor materials (indium gallium arsenide, gallium arsenide), etc. Further, for example, in one or more embodiments, the substrate 12 can include one or more metals, e.g., titanium, copper, palladium, silver, etc. In one or more embodiments, the substrate 12 can include one or more materials that are transparent to one or more wavelengths of the electromagnetic radiation emitted by the particle converting material 40.

As mentioned herein, the substrate 12 includes a structured surface 14 (i.e., the first major surface) that includes one or more structures 20 (e.g., one or more cavities). Each cavity 20 can include the sidewall 22 that extends from the first major surface 14 to a bottom wall 24. The cavity 20 can take any suitable shape or combination of shapes and have any suitable dimensions. As can be seen in FIG. 2, each cavity 20 of the structured surface 14 can take a circular cross-sectional shape in a plane parallel to the structured surface 14. Further, the cavities 20 can be arranged in a periodic array. Although depicted as including cavities 20 of equal size and cross-sectional shape, in one or more embodiments, the structured surface 14 can include cavities 20 having various cross-sectional shapes and dimensions. For example, in one or more embodiments, the structured surface 14 can include a first set of cavities each having a first cross-sectional shape and dimensions, and a second set of cavities each having a second cross-sectional shape and dimensions that are different from the first set of cavities. Further, although each of the cavities 20 are depicted as having a cross-sectional area that is constant in a direction along a normal to the structured surface 14 of substrate 12, in one or more embodiments, one or more of the cavities can include a cross-sectional area that varies along the normal to the structured surface, e.g., one or more of the cavities can have one or more tapered sidewalls 22. In one or more embodiments, the sidewall 22 of cavity 20 can have a normal axis 28 (FIG. 1) that extends through the sidewall. In one or more embodiments, the normal axis 28 does not intersect the input surface 62 of the photovoltaic device 60.

In one or more embodiments, the substrate 12 can include gas permeable material with high specificity to aid in diffusing new species, such as 3He (helium) produced when the tritium undergoes a radioactive decay, out of the cavity 20. This can eliminate or reduce pressure build-up within the cavity, or reduce the need to increase the volume of the cavity 20 to contain the gaseous species produced during radioactive decay. For helium, typical substrate materials can include glasses, such as BSG, BF etc.

As illustrated in FIG. 1, each cavity 20 of the structured surface 14 has a substantially smooth sidewall 22 and a smooth bottom wall 24. In one or more embodiments, one or both of the sidewall 22 and bottom wall 24 can have a roughened surface or irregular surface. Further, each cavity 20 can have any suitable depth as measured from the structured surface 14 to the bottom wall 24 of the cavity. In one or more embodiments, the cavity 20 can extend from the structured surface 14 to the second major surface 16.

Disposed within one or more of the cavities 20 is the radioactive material 30. The radioactive material 30 can be any suitable material that emits one or more radiation particles. For example, in one or more embodiments, the radioactive material 30 can include a plurality of radiation-emitting radioisotopes, e.g., tritium 3H, 60Co, 63Ni, 90Sr, 99Tc, 127Cs and combinations thereof. Further, the radioactive material 30 can be in any suitable form, e.g., gas, liquid, solid, powder dispersed into a liquid/solid phase, etc. The radioactive material 30 can emit any suitable type of particles, e.g., alpha, beta, gamma, x-ray, etc.

The radioactive material 30 can be disposed in any suitable location within one or more of the cavities 20. In one or more embodiments, the radioactive material 30 can be disposed on one or more regions 15 of the first major surface 14 of the substrate 12 outside of the one or more cavities 20. In one or more embodiments, the radioactive material 30 can be disposed within one or more of the cavities 20 and on one or more regions 15 of the first major surface 14 of the substrate 12 outside of the one or more cavities 20. In one or more embodiments, the radioactive material 30 can be disposed on one or more of the walls of the cavity 20, e.g., the sidewall 22, such that the radioactive material is between the particle converting material 40 and the sidewall. Further, in one or more embodiments, the particle converting material 40 can be disposed on one or more of the walls of one or more cavities 20 such that the particle converting material is between the radioactive material 30 and the wall.

When disposed on one or more of the walls of the cavities 20, the radioactive material 30 can be disposed in any suitable configuration. For example, in one or more embodiments, the radioactive material 30 can be disposed over the entire sidewall 22 of the cavity 20 and on the bottom wall 24. Further, in one or more embodiments, the radioactive material 30 can be patterned on one or both of the sidewall 22 and bottom wall 24 of the cavity 20. Any suitable technique or combination of techniques can be utilized to dispose the radioactive material 30 within one or more of the cavities 20, e.g., gas diffusion, liquid diffusion, Atomic Layer Deposition (ALD), Metal Organic Chemical Vapor Deposition (MOCVD), etc.

The radioactive material 30 can be disposed such that it forms a radioactive material layer. In such embodiments, the radioactive material layer 30 can be disposed on one or more of the walls 22, 24 of one or more cavities 20. In one or more embodiments, the radioactive material layer 30 can be disposed on one or more regions 15 of the first major surface 14 of the substrate 12 outside of the one or more of the cavities 20. Further, in one or more embodiments, the radioactive material layer 30 can be disposed on one or more of the walls 22, 24 of one or more cavities 20 and on one or more regions 15 of the first major surface 14 of the substrate 12 as illustrated in FIG. 1.

As mentioned herein, the radioactive material 30 can include any suitable form or phase of material. For example, in embodiments where the radioactive material 30 is in a gas phase, the radioactive material can be disposed within an enclosure that is then disposed within the substrate 12. Any suitably-shaped enclosure or container can be utilized to contain the gas-phase radioactive material 30, e.g., cylinders, rectangular plates, pyramids, spheres, etc. In one or more embodiments, the shape of one or more of the enclosures that contain the gas-phase radioactive material 30 can be selected to provide an optimal stacking configuration within the substrate 12. In one or more embodiments, a gas-phase radioactive material 30 can be disposed within one or more of the cavities 20, and the cavity can be sealed using any suitable technique or combination of techniques, e.g., the sealing layer 50 can be disposed over the one or more cavities such that the radioactive material is hermetically sealed within the cavity as is further described herein Further, for example, for embodiments where it is desirable that the radioactive material 30 is in a solid form, the gaseous radioactive material can be combined with other elements to produce suitable compounds. This is typically done to improve the density of the radioactive material 30 without the need for high pressures that would be required to achieve similar densities using radioactive material in a gaseous form. For example, the radioactive material 30 can be formed as a tritium containing compound such as titanium tritide, a complex network (e.g., phosphorene), a gel (e.g., air gels, silica gels), or disposed within a solid rod, powder, bead, plate, thin-film, etc.

In embodiments where the radioactive material 30 is disposed within a liquid dispersion, any suitable matrix can be utilized to contain the radioactive material. For example, in one or more embodiments, the radioactive material 30 can be disposed in a matrix of at least one of a tritiated polymer (e.g., polystyrene, silicone, PMA, polyamide, urethane, PVA), photo-image paste, silicon (amorphous or crystalline), etc.

The radioactive material 30 may also be introduced in one form, such as a gas phase, and then be in situ converted into a liquid or sold phase as it reacts with a carrier material. For example, tritium can be introduced in a gaseous phase, with the deposited final radioactive material-carrying layer being titanium or palladium, in which case, the tritium is absorbed into the metal and converted into a solid phase, allowing for a much higher tritium per volume concentration. In one or more embodiments, gaseous tritium can be introduced into a substrate coated with a carrier material (such as copper oxide), where the tritium reduces the copper oxide, and then forms copper and a liquid phase radioactive material (tritium water), which can also have a higher tritium-per-volume density.

Also disposed within one or more of the cavities 20 is the particle converting material 40. The particle converting material 40 can convert one or more radiation particles emitted by the radioactive material 30 into electromagnetic radiation, e.g., light. The particle converting material 40 can include any suitable material or combination of materials, e.g., one or more of phosphor, ZnS:Ag, ZnS:Mn, ZnO:Zn, (Zn, Cd)S:Cu, Y2O3S:Eu, Y2O3:Eu, Y2O3:Er, YVO4:Eu, YVO4:Er.

In one or more embodiments, the particle converting material 40 can include nanocrystals. As used herein, the term "nanocrystal" refers to nanostructures that are substantially monocrystalline. A nanocrystal has at least one region or characteristic dimension with a dimension of less than about 500 nm, and down to on the order of less than about 1 nm. The terms "nanocrystal," "nanodot," "dot," and "quantum dot" are readily understood by the ordinarily skilled artisan to represent like structures and are used herein interchangeably. The present disclosure also encompasses the use of polycrystalline or amorphous nanocrystals. Typically, the region of characteristic dimension will be along the smallest axis of the structure. Nanocrystals can be substantially homogenous in material properties, or in some embodiments, can be heterogeneous.

The material utilized for the particle converting material 40 can be selected such that the material emits electromagnetic radiation at any desired wavelength or within any desired wavelength range. For example, in one or more embodiments, the particle converting material 40 is adapted such that it emits electromagnetic radiation in the visible spectrum, i.e., visible light. In one or more embodiments, the particle converting material 40 can be selected such that it emits light in the UV, infrared, or near-infrared wavelength range. The particle converting material 40 can be selected such that it emits light at a single wavelength, two or more discrete wavelengths, or a range of wavelengths, e.g., 190 nm to 450 nm, 364 nm to 640 nm, or 530 nm to 2000 nm. The specific wavelength used is an optimization of the conversion of radioactive particles to electromagnetic radiation and the associated photovoltaic device's light-to-electric-power-conversion efficiency.

The particle converting material 40 can be disposed in any suitable location within one or more of the cavities 20, on one or more regions 15 of the first major surface 14 of substrate 12 outside of the one or more cavities 20, on the second major surface 16, or within one or more of the cavities and on one or more regions of the first major surface of the substrate outside of the cavities. In one or more embodiments, the particle converting material 40 can be disposed on one or both of the sidewall 22 and bottom wall 24 of one or more cavities 20 such that the particle converting material is between the radioactive material 30 and the respective cavity wall. Further, in one or more embodiments, the particle converting material 40 can be disposed within one or more of the cavities 20 such that the radioactive material 30 is between the particle converting material and one or both of the sidewall 22 and the bottom wall 24 of the respective cavity. When disposed on one or more of the walls of one or more cavities 20, the particle converting material 40 can be disposed in any suitable configuration. For example, in one or more embodiments, the particle converting material 40 can be disposed over the entire sidewall 22 of the cavity 20 and on the bottom wall 24. Further, in one or more embodiments, the particle converting material 40 can be patterned on one or both of the sidewall 22 and bottom wall 24 of the cavity 20. Any suitable technique or combination of techniques can be utilized to dispose the particle converting material 40 within one or more of the cavities 20, e.g., ALD, MOCVD, liquid dispersion, printing, etc.

The particle converting material 40 can be disposed such that it forms a particle converting layer. In such embodiments, the particle converting material layer 40 can be disposed on at least a portion of the radioactive material 30 that is disposed within at least one of the cavities 20, on a region or regions 15 of the first major surface 14 of the substrate 12 outside of the cavities, or disposed within at least one of the cavities and a region or regions of the first major surface outside of the cavities. The particle converting material layer 40 can be disposed within one or more of the cavities 20 such that it fills the cavity. In one or more embodiments, the particle converting material layer 40 can be disposed within the cavity 20 such that a gap is formed within the cavity, i.e., the particle converting material partially fills the cavity.

As illustrated in FIG. 1, both the radioactive material 30 and the particle converting material 40 are disposed within one or more of the cavities 20 and on one or more regions 15 of the first major surface 14 of the substrate 12 outside of the one or more cavities. In one or more embodiments, one or both of the radioactive material 30 and particle converting material 40 can form conformal layers over the structured surface 14 of the substrate 12. In one or more embodiments, one or both of the radioactive material 30 and particle converting material 40 can be patterned within one or more of the cavities 20, in regions 15 of the structured surface 14 outside of the one or more cavities, or both within and outside of the one or more cavities. Any suitable technique or combination of techniques can be utilized to pattern one or both of the radioactive material 30 and the particle converting material 40.

The power source 10 can include the sealing layer 50 disposed over the structured surface 14. The sealing layer 50 can include any suitable material or combination of materials, e.g. metallic oxides, metallic nitrides, metals, such as Ti, Al, Cu. The sealing layer 50 can be disposed using any suitable technique or combination of techniques, e.g., ALD, MOCVD, sputtering, evaporation, plating, etc.

The sealing layer 50 can be disposed such that the radioactive material 30 and the particle converting material 40 are disposed between the sealing layer and the first major surface 14 of the substrate 12. In one or more embodiments, the sealing layer 50 can seal the radioactive material 30 and particle converting material 40 between the sealing layer and the substrate 12 such that the particle converting material and the radioactive material are sealed within one or more of the cavities 20, on one or more regions 15 of the structured surface 14 outside of the cavities, or within one or more of the cavities and on one or more regions of the structured surface outside of the cavities. In one or more embodiments, the sealing layer 50 is disposed such that the particle converting material 40 and the radioactive material 30 are hermetically sealed between the sealing layer and the substrate 12, e.g., within one or more of the cavities 20.

The sealing layer 50 can include any suitable number of layers and can be disposed over the first major surface 14 of the substrate 12 using any suitable technique or combination of techniques. In one or more embodiments, the sealing layer 50 is a conformal layer that conforms to the layer or layers upon which it is disposed. For example, in the embodiment illustrated in FIGS. 1-2, the sealing layer 50 is disposed on the particle converting material layer 40 and can conform to the shape of the particle converting material layer.

In one or more embodiments, the power source 10 can also include an antireflective layer 70 disposed between the sealing layer 50 and the input surface 62 of the photovoltaic device 60. The antireflective layer 70 can include any suitable material or combination materials that can direct at least a portion of light emitted by the particle converting material 40 through the input surface 62 of the photovoltaic device 60, e.g., metallic oxides, metallic nitrides, and combinations thereof.

Disposed adjacent the substrate 12 is the photovoltaic device 60. The device 60 can include any suitable device or combination of devices that can convert at least a portion of the electromagnetic radiation emitted by the particle converting material 40 that is incident upon the input surface 62 of the device into electrical energy, e.g., current. For example, the photovoltaic device 60 can include at least one of a photodiode, pn junction, p-i-n junction, or multilayered multi junction photon convertor, which include Si, Ge, SiGe, GaN, GaAs, AlGaAs, InGaP, GaP, SiC, etc. The photovoltaic device 60 can be adapted to convert any suitable wavelength or range of wavelengths of electromagnetic radiation emitted by the particle converting material 40 into electrical energy. Further, the photovoltaic device 60 can be electrically connected to one or more electronic devices using any suitable technique or combination of techniques to provide electrical energy to the electronic devices. The photovoltaic device 60 can also form the substrate 12 itself, with the sealing layer 50 functioning as a mechanical layer and that can also include a reflective layer to direct a portion of the electromagnetic radiation emitted by the particle converting material 40 to the photovoltaic device. In one or more embodiments, both the cavity 20 and the sealing layer 50 can be formed by the photovoltaic device 60. The photovoltaic device 60 can also form a portion of the cavity 20, or an additional non-active layer may be used between two photovoltaic devices to form a cavity.

In one or more embodiments, the power source 10 can provide electrical energy to one or more electronic devices that is electrically connected to the power source. For example, in one or more embodiments, the radioactive material 30 can emit one or more radiation particles, e.g., beta particles. One or more of these beta particles can be incident upon the particle converting material 40. The material 40 can convert one or more of these beta particles into electromagnetic radiation, e.g., light. At least a portion of the electromagnetic radiation emitted by the particle converting material 40 can be incident upon the input surface 62 of the photovoltaic device 60. The device 60 can convert at least a portion of the electromagnetic radiation incident upon the input surface 62 into electrical energy. This electrical energy can then be directed to one or more electronic devices that are electrically connected to the photovoltaic device.

The power source 10 can include an additional layer or layers 80 that can provide additional functionality to the source. For example, in one or more embodiments, the additional layer 80 can include a reflective layer disposed between the substrate 12 and the particle converting material 40. The reflective layer can include any suitable material or combination of materials, e.g., metal, polymeric, metallic oxides, metallic nitrides, etc. The reflective layer can be disposed within one or more cavities 20, on one or more regions 15 of the first major surface 14 outside of the one or more cavities, or both within one or more cavities and on one or more regions of the first major surface outside of the one or more cavities. The reflective layer can be formed using any suitable technique or combination of techniques.

In the embodiment illustrated in FIGS. 1-2, the reflective layer is disposed on one or both of the sidewall 22 and bottom wall 24 of one or more cavities 20 and on regions 15 of the first major surface 14 outside of the cavities. In the illustrated embodiment, the radioactive material 30 can be disposed on the reflective layer. In one or more embodiments, one or more additional layers can be disposed between the radioactive material 30 and the reflective layer. The reflective layer can be adapted to direct at least a portion of electromagnetic radiation emitted by the particle converting material 40 toward the input surface 62 of the photovoltaic device 60.

Further, the additional layer 80 can also include an anti-diffusion layer disposed between the radioactive material 30 and the substrate 12. The anti-diffusion layer can include any suitable material or combination of materials, e.g., metallic oxides, metallic nitrides (e.g., TiN, TiO2 etc), and combinations thereof. Further, the anti-diffusion layer can be formed using any suitable technique or combination of techniques, e.g., ALD, MOCVD, sputtering, evaporation, plating, etc. In one or more embodiments, such anti-diffusion layer can prevent the diffusion of one or more radiation particles emitted by the radioactive material 30 into the substrate 12.

Figure 14:
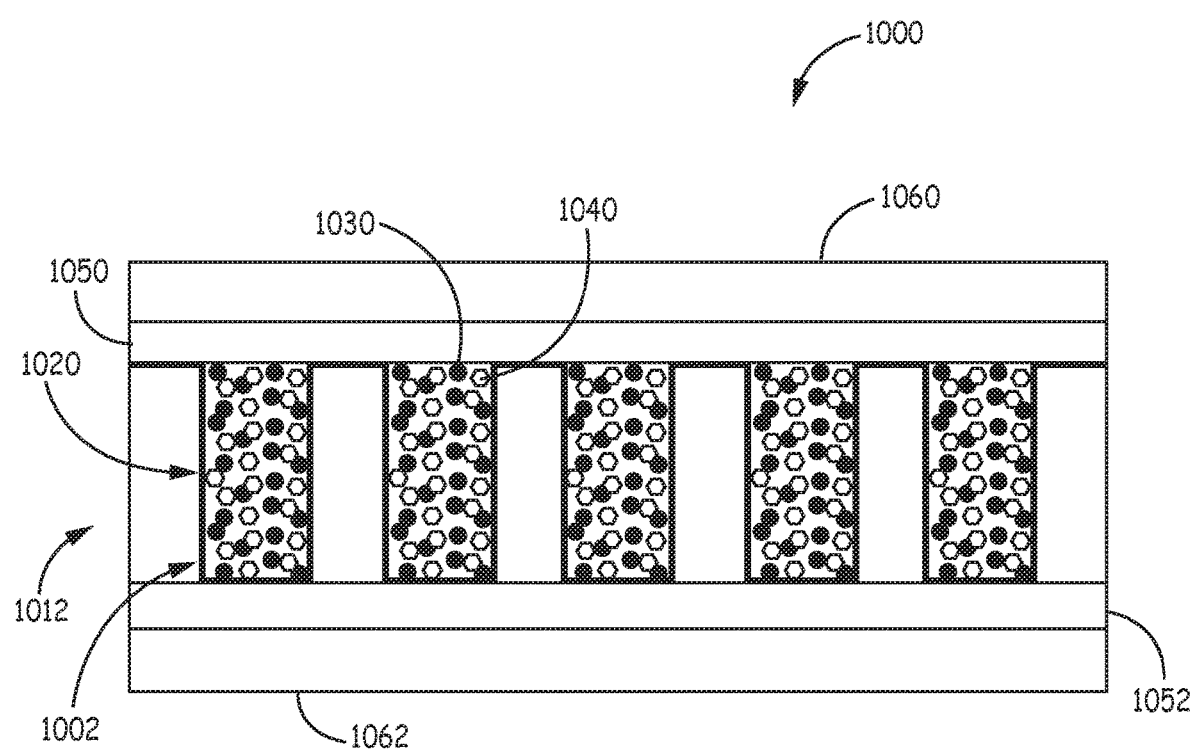
FIG. 14 is a schematic cross-section view of another embodiment of a power source.

As mentioned herein, the various embodiments of power sources described herein can include radioactive material and particle converting material disposed within one or more structures or cavities of a substrate in any suitable form. For example, FIG. 14 is a schematic cross-section view of another embodiment of a power source 1000. All of the design considerations and possibilities regarding the power source 10 of FIGS. 1-2 apply equally to the power source 1000 of FIG. 14. One difference between power source 1000 and power source 10 is that source 1000 includes radioactive material 1030 and particle converting material 1040 disposed in cavities 1020 as a mixture 1002, with particles of the radioactive material disposed in close proximity to particles of the particle converting material. The cavities 1020 can be disposed in substrate 1012 in any suitable configuration. And the mixture 1002 can be sealed within the cavities 1020 by a first seal layer 1050 and a second optional seal layer 1052 if the cavities are disposed through the substrate 1012.

Radioactive material 1030 can include any suitable material or combination of materials, e.g., the materials described herein in reference to radioactive material 30 of power source 10. The radioactive material 1030 can be selected such that the material does not absorb the electromagnetic ration spectrum emitted by the particle conversion material 1040. In one or more embodiments, the particle conversion material 1040 may instead reflect the electromagnetic radiation, aiding in the direction of the electromagnetic radiation to an electromagnetic particle collector, for example, a photovoltaic diode. Further, the particle converting material 1040 can include any suitable material or combination of materials, e.g., the materials described herein in reference to particle converting material 40 of power source 10. In one or more embodiments, the mixture 1002 can include a matrix within which the radioactive material 1030 and the particle converting material 1040 are disposed. Any suitable material or combination of materials can be utilized to form the matrix. Further, any suitable technique or combination of techniques can be utilized to form the mixture 1002.

Another difference between power source 1000 and power source 10 is that source 1000 includes a first photovoltaic device 1060 and a second photovoltaic device 1062. Each of photovoltaic devices 1060, 1062 can include any suitable device. Further, the photovoltaic devices 1060, 1052 can be disposed in any suitable location relative to the substrate 1012 to receive at least a portion of light emitted by the particle converting material 1040 of the mixture 1002.

As mentioned herein, the various embodiments of power sources can be formed using any suitable technique or combination of techniques. For example, the power source 10 illustrated in FIGS. 1-2 can be formed by first disposing one or more structures 20 in or on one or both of the major surfaces 14, 16 of the substrate 12, and then disposing the radioactive material 30 and particle converting material 40 within one or more of the structures. In one or more embodiments, one or more structures 20 can be formed and then at least partially encased in a material or combination of materials that provide a substrate for the structures.

Figure 3:
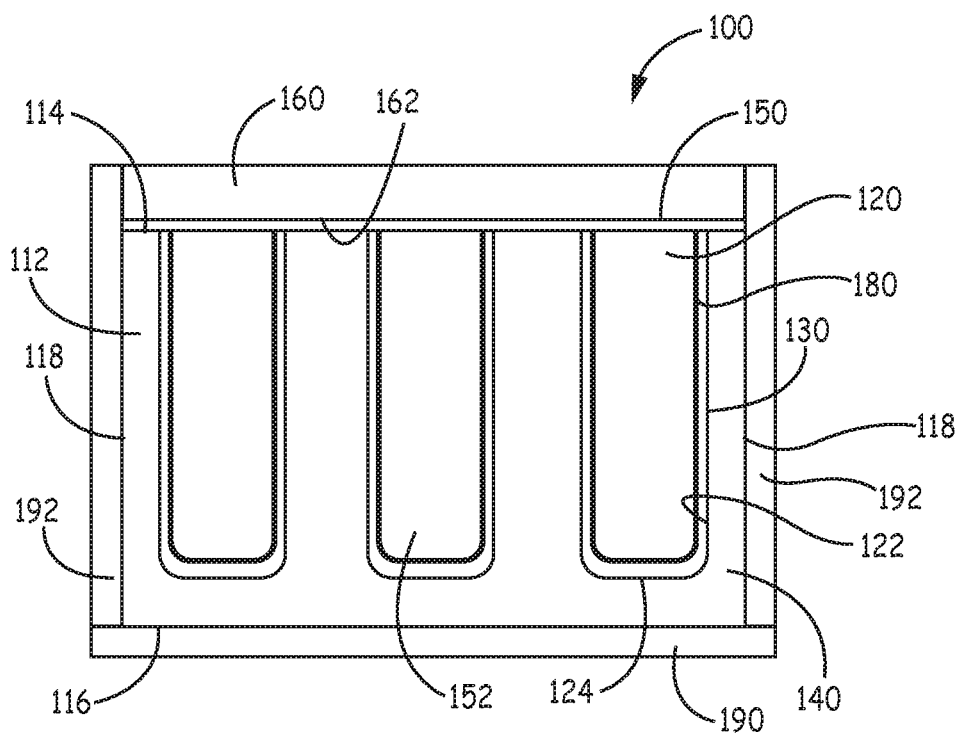
FIG. 3 is a schematic cross-section view of another embodiment of a power source.
Figure 4:
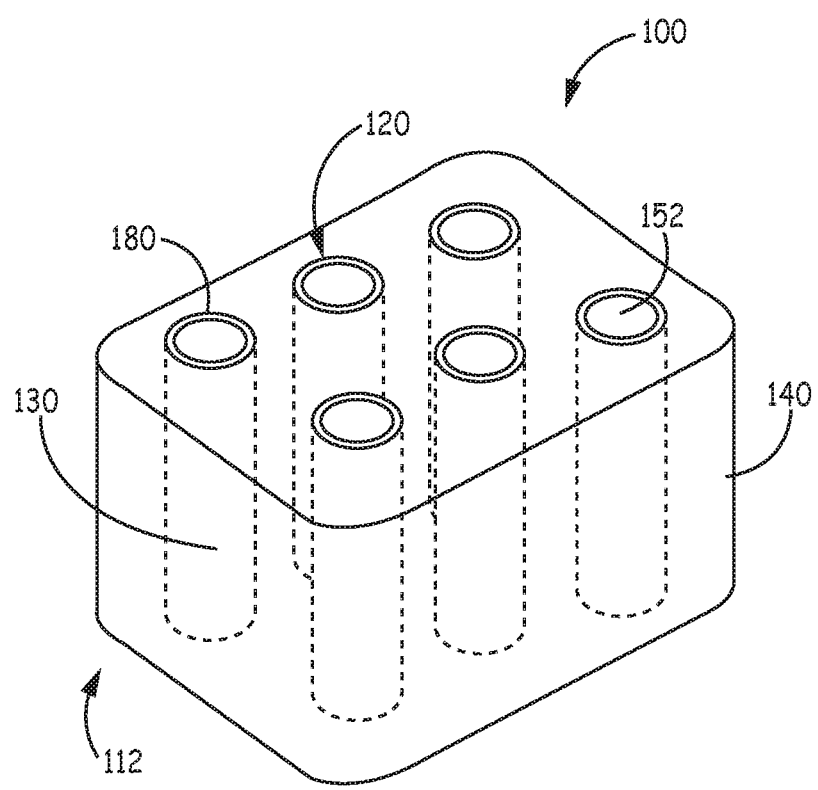
FIG. 4 is a schematic perspective view of the power source of FIG. 3.

For example, FIGS. 3-4 are various views of another embodiment of a power source 100. All of the design considerations and possibilities regarding the power source 10 of FIGS. 1-2 apply equally to the power source 100 of FIGS. 3-4. As illustrated, power source 100 includes a substrate 112 that has a first major surface 114 and a second major surface 116. One or more structures 120 (e.g., cavities) are disposed in the first major surface 114 of the substrate 112.

One difference between the power source 100 of FIGS. 3-4 and power source 10 of FIGS. 1-2 is that support material 152 is disposed within one or more of the structures 120. The support material 152 can include any suitable material or combination of materials, e.g., glass, silicon, titanium, palladium, platinum, tantalum, nickel, magnesium, manganese, etc.

Radioactive material 130 can be disposed within one or more structures 120 between the support material 152 and one or both of a sidewall 122 and bottom wall 124 of the respective structure. In one or more embodiments, one or more additional layers can be disposed between the support material 152 and the radioactive material 130. For example, at least one of an adhesion layer and an anti-diffusion layer 180 can be disposed between the support material 152 and the radioactive material 130. Any suitable material or combination of materials can be utilized for the adhesion layer, e.g., nickel, titanium, tantalum, copper, etc. Further, any suitable material or combination of materials can be utilized for the anti-diffusion layer 180, e.g., the same materials described regarding the anti-diffusion layer 80 of the power source 10 of FIGS. 1-2.

The power source 100 can also include particle converting material 140 disposed adjacent at least a portion of the radioactive material 130. As used herein, the term "adjacent" means that the particle converting material 140 is disposed such that it can receive one or more radiation particles emitted by the radioactive material 130. In one or more embodiments, the particle converting material 140 can be disposed within the substrate 112. Further, in one or more embodiments, the particle converting material 140 can form the substrate 112. For example, the one or more structures 120 can be formed and then coated or encased within the particle converting material 140. Any suitable technique or combination of techniques can be utilized to form the particle converting material 140. In one or more embodiments, the particle converting material 140 can be disposed on the first major surface of the substrate 114 between the radioactive material 130 and an input surface 162 of a photovoltaic device 160.

Further, in one or more embodiments, the power source 100 can include an additional layer 150 disposed between the particle converting material 140 and the input surface 162 of the photovoltaic device 160, e.g., the anti-reflection layer 70 of power source 10 of FIGS. 1-2.

Further, the power source 100 can include one or more reflectors 190 and 192 disposed adjacent at least one of the second major surface 116 of the substrate 112 and one or more side surfaces 118 of the substrate. The reflectors 190, 192 can include any suitable reflector, e.g., metallic, polymeric, etc.

Any suitable technique or combination of techniques can be utilized to form the structures 120. For example, in one or more embodiments, the support material 152 can be formed and then coated with the additional layer 180 (e.g., at least one of the optional adhesion or diffusion barrier layer). The radioactive material 130 can be disposed on the support material 152 or the additional layer 180 using any suitable technique or combination of techniques. The structures 120 can be disposed within the substrate 112. In one or more embodiments, the substrate 112 can be formed around the structures 120 such that the substrate fills interstitial spaces between the structures. Further, in one or more embodiments, the material or materials used to form the substrate 112 can encase the structures 120.

Figure 5:
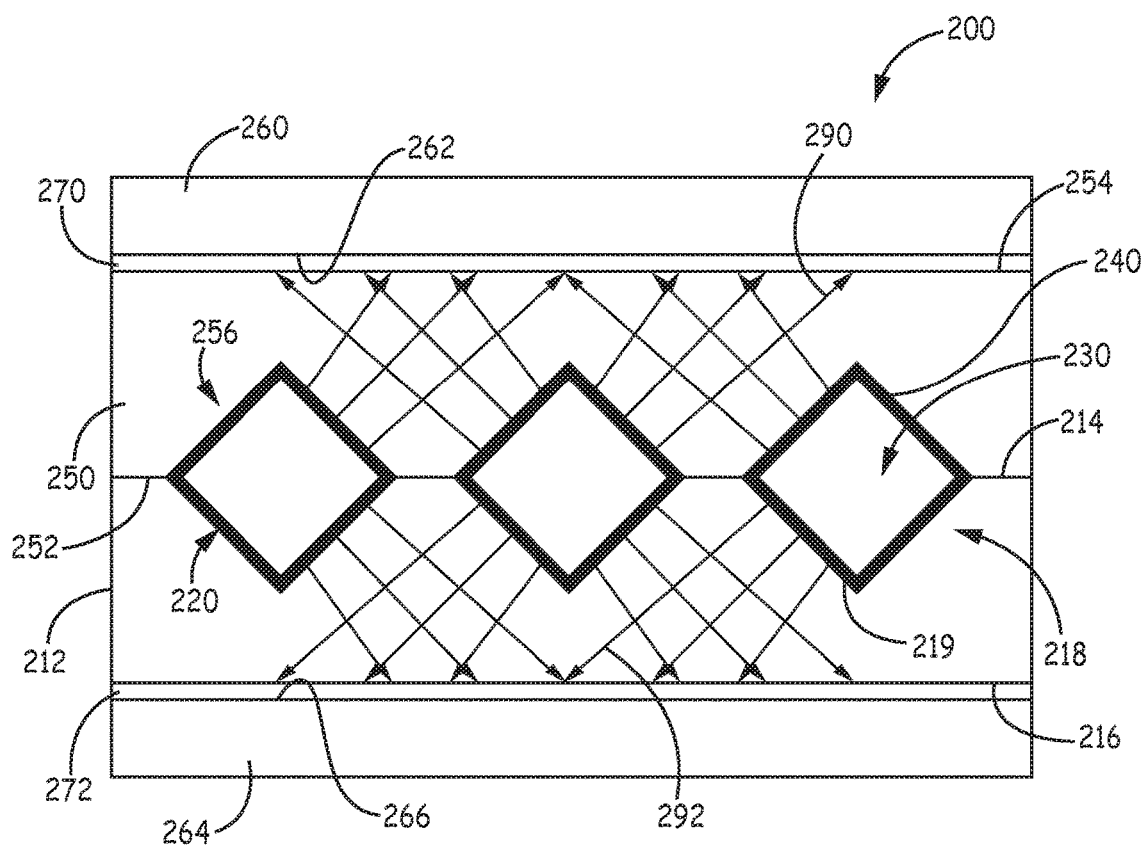
FIG. 5 is a schematic cross-section view of another embodiment of a power source.

As mentioned herein, the structures of the structured surface of one or more embodiments of a power source can include any suitable shape or combination of shapes. In one or more embodiments, the sealing layer can also include one or more structures that can be registered or aligned with the structures formed in the substrate. For example, FIG. 5 is a schematic cross-section view of another embodiment of a power source 200. All of the design considerations and possibilities regarding the power source 10 of FIGS. 1-2 and the power source 100 of FIGS. 3-4 apply equally to the power source 200 of FIG. 5.

One difference between power source 200 of FIG. 5 and power source 10 of FIGS. 1-2 is that sealing layer 250 includes one or more structures 256 disposed in a first major surface 252 of the layer. The structures 256 can take any suitable shape or combination of shapes. In one or more embodiments, the structures 256 can include cavities. In one or more embodiments, the cavities 256 of the sealing layer 250 can be aligned in a direction orthogonal to a first major surface 214 of substrate 212 with cavities 220 disposed in the first major surface of the substrate. The cavities 256 of the sealing layer 250 and the cavities 220 of the substrate 212 can form a sealed cavity 218 within which at least one of radioactive material 230 and particle converting material 240 can be disposed. Each sealed cavity 218 can take any suitable shape or combination of shapes.

The sealing layer 250 can include any suitable material or combination of materials, e.g., the same material or materials described regarding sealing layer 50 of power source 10. Further, the sealing layer 250 can be disposed over or on the substrate 212 using any suitable technique or combination of techniques. In one or more embodiments, the first major surface 252 of the sealing layer 250 can be disposed on the first major surface 214 of the substrate 212. Any suitable technique or combination of techniques can be utilized to attach the sealing layer 252 the substrate 212.

The particle converting material 240 can be disposed in any suitable location within one or more sealed cavities 218. In one or more embodiments, the particle converting material 240 can be disposed on one or more inner surfaces 219 of the sealed cavity 218. Further, the radioactive material 230 can be disposed in any suitable location within one or more sealed cavities 218. In one or more embodiments, the radioactive material 230 can include a gas or combination of gases disposed within one or more sealed cavities 218. In such embodiments, the radioactive material gas 230 is sealed within one or more sealed cavities 218.

The power source 200 can also include a photovoltaic device 260 disposed adjacent a second major surface 254 of the sealing layer 250 such that an input surface 262 of the device can receive at least a portion of electromagnetic radiation 290 emitted by the particle converting material 240. In one or more embodiments, an additional layer 270 can be disposed between the input surface 262 of the photovoltaic device 260 and the second major surface 254 of the sealing layer 250, e.g., an anti-reflective layer (e.g., anti-reflective layer 70 of FIG. 1).

In one or more embodiments, the power source 200 can also include a second photovoltaic device 264 disposed adjacent a second major surface 216 of the substrate 212. The second photovoltaic device 264 can be the same as the photovoltaic device 260 or different from the photovoltaic device. The second photovoltaic device 264 can be disposed such that at least a portion of electromagnetic radiation 292 emitted by the particle converting material 240 is incident upon an input surface 266 of the second photovoltaic device. Further, in one or more embodiments, an additional layer or layers 272 can be disposed between the second major surface 216 of the substrate 212 and the input surface 266 of the second photovoltaic device 264, e.g., an anti-reflective layer.

The photovoltaic device 260 and the second photovoltaic device 264 can be electrically connected using any suitable technique or combination of techniques. In one or more embodiments, the photovoltaic device 260 can be electrically connected to a first set of electronic devices, and the second photovoltaic device 264 can be electrically connected to a second set of electronic devices that is different from the first set of electronic devices.

Figure 6:
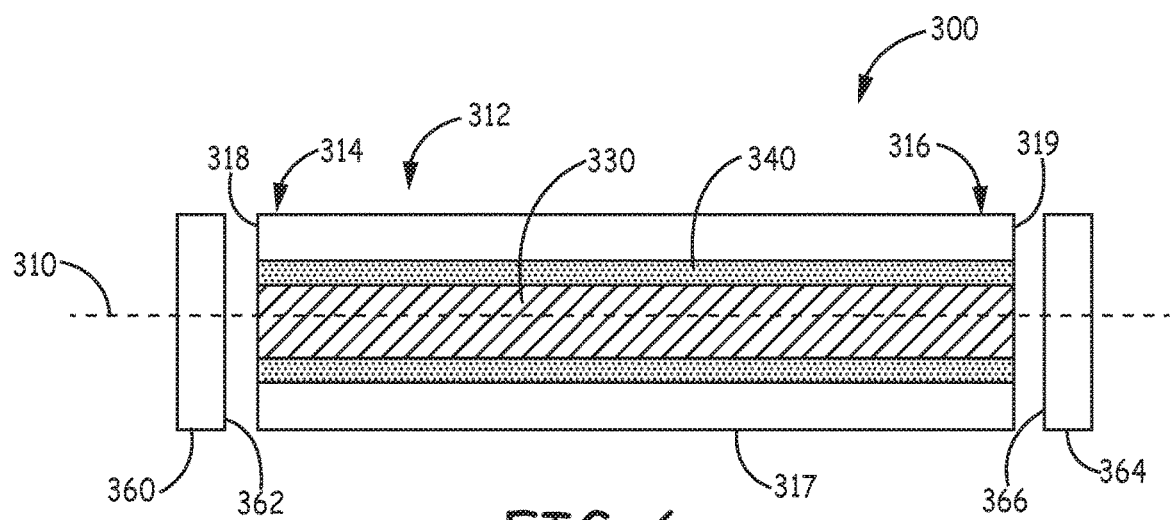
FIG. 6 is a schematic cross-section view of another embodiment of a power source.
Figure 7:
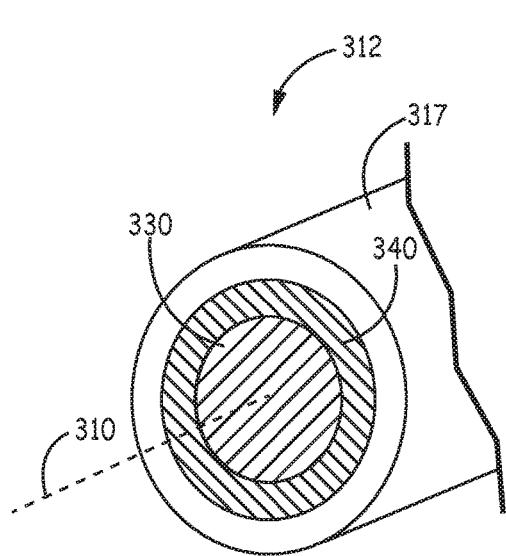
FIG. 7 is a schematic cross-section view of one embodiment of a light guide.

In general, the various embodiments of power sources described herein can include one or more substrates having any suitable shape or combination of shapes. For example, FIGS. 6-7 are various views of one embodiment of a power source 300. All of the design considerations and possibilities regarding the power source 10 of FIGS. 1-2 apply equally to the power source 300 of FIGS. 6-7. The power source 300 includes a substrate 312 that can take any suitable shape or combination of shapes, e.g., the substrate can form a light guide. As illustrated in FIGS. 6-7, the light guide 312 can extend along a light guide axis 310 between a first end 314 and a second end 316 of the light guide. The light guide 312 includes an outer surface 317 that extends between the first end 314 and the second end 316. The light guide 312 can also include an emitting surface 318 disposed at or adjacent the first end 314. In one or more embodiments, the light guide 312 can also include a second emitting surface 319 disposed at or adjacent the second end 316. Although depicted as having two emitting services 318, 319, the light guide 312 can have any suitable number of emitting surfaces.

The light guide 312 can have any suitable shape in a plane orthogonal to the light guide axis 310. As illustrated in FIGS. 6-7, the light guide 312 has a circular or elliptical shape in the plane orthogonal to the light guide axis 310. The light guide 312 can also have any suitable thickness in a plane orthogonal to the light guide axis 310. In one or more embodiments, the light guide 312 can have a constant thickness along the light guide axis 310. In one or more embodiments, the light guide 312 can have a thickness that varies along the light guide axis 310.

The power source 300 also includes radioactive material 330 disposed within the light guide 312. The radioactive material 330 is adapted to emit radiation particles. In one or more embodiments, the radioactive material 330 can be disposed in any suitable location on or within the light guide 312. For example, in one or more embodiments, the radioactive material 330 can be disposed along the light guide axis 310. The radioactive material 330 can be disposed in any suitable pattern or shape along the light guide axis 310. In one or more embodiments, the radioactive material 330 can be disposed along the light guide axis 310 such that it is symmetrical about the axis. For example, as illustrated in FIG. 7, the radioactive material 330 is disposed along the light guide axis 312 such that it is rotationally symmetrical about the axis. The radioactive material 330 can have any suitable thickness in a plane orthogonal to the light guide axis 310 that is constant along the light guide axis or varies along the light guide axis.

The power source 300 can also include particle converting material 340. The particle converting material 340 is adapted to convert at least one or more of the radiation particles emitted by the radioactive material 330 into electromagnetic radiation, e.g., light. The power converting material 340 can be disposed in any suitable location on or within the light guide 312. For example, the particle converting material 340 can be disposed in any suitable location or locations within the light guide, e.g., along the light guide axis 310. The particle converting material 340 can be disposed in any suitable shape or pattern along the light guide axis 310. For example, as shown in FIG. 7, the particle converting material 340 is disposed within the light guide 312 such that it is rotationally symmetrical about the light guide axis 310. The particle converting material 340 can have any suitable thickness in a plane orthogonal to the light guide axis 310 that is constant along the light guide axis or varies along the light guide axis.

The particle converting material 340 can be disposed on or within the light guide 312 in any suitable relation to the radioactive material 330. As illustrated in FIGS. 6-7, the particle converting material 340 is disposed such that it is between the radioactive material 330 and the outer surface 317 of the light guide 312. In one or more embodiments, the particle converting material 340 can be disposed such that the radioactive material 330 is between the particle converting material and the outer surface 317.

The power source 300 can also include a photovoltaic device 360 disposed adjacent the emitting surface 318 of the light guide 312 such that at least a portion of electromagnetic radiation emitted by the particle converting material 340 is incident upon an input surface 362 of the device. In one or more embodiments, the photovoltaic device 360 is adapted to convert at least a portion of the electromagnetic radiation emitted by the particle converting material 340 that is incident upon the input surface 362 of the device into electrical energy.

In one or more embodiments, the power source 300 can also include a second photovoltaic device 364 disposed adjacent the second emitting surface 319 of the light guide 312 such that at least a portion of electromagnetic radiation emitted by the particle converting material 340 is incident upon an input surface 366 of the device. The second photovoltaic device 364 can be the same device or devices utilized for the photovoltaic device 360 or a different device or devices.

In general, one or more radiation particles can be emitted by the radioactive material 330 disposed within the light guide 312. One or more of these particles can be converted by the particle converting material 340 into electromagnetic radiation. At least a portion of the electromagnetic radiation emitted by the particle converting material 340 is incident upon one or both of the photovoltaic devices 360, 364 such that it is converted by one or both devices into electrical energy.

Electromagnetic radiation emitted by the particle converting material 340 may be directed toward the outer surface 317 of the light guide 312 and not toward the emitting surfaces 318, 319. Such electromagnetic radiation may be reflected or directed by the outer surface 317 such that it remains within the light guide 312 and is directed toward one or both emitting surfaces 318, 319. In one or more embodiments, such electromagnetic radiation may be directed by the outer surface 317 using any suitable technique or combination of techniques. For example, in one or more embodiments, total internal reflection may occur at the boundary of the outer surface 317 and air or other gas or material surrounding the light guide 312. In one or more embodiments, one or more reflective materials may be disposed on or adjacent the outer surface 317 that are adapted to direct incident light emitted by the particle converting material 340 back into the light guide 312, where it can then be directed towards one or both of the emitting surfaces 318, 319.

Any suitable technique or combination of techniques can be utilized to form the power source 300. For example, in one or more embodiments, the radioactive material 330, particle converting material 340, and the light guide 312 can be coextruded such that they are concentrically disposed along the light guide axis 310. In one or more embodiments, one or more of the radioactive material 330, particle converting material 340, and the light guide 312 can be dip-coated onto a substrate or supporting material.

Figure 8:
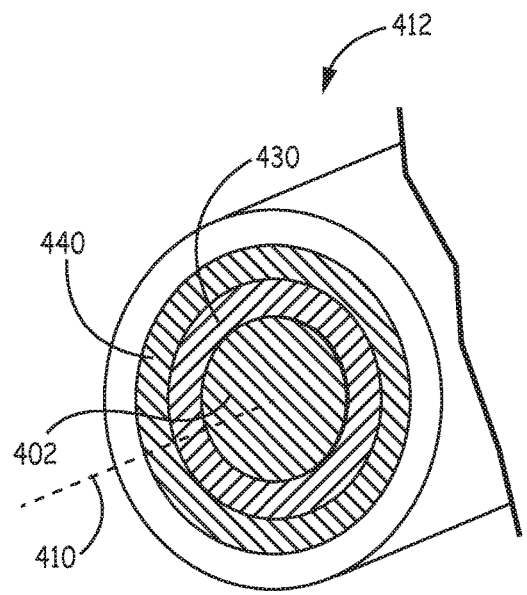
FIG. 8 is a schematic cross-section view of another embodiment of a light guide.

As mentioned herein, the radioactive material 330 and the particle converting material 340 can be disposed in any suitable location or locations within the light guide 312. In one or more embodiments, an inert material can be disposed within the light guide 312 such that one or both of the radioactive material 330 and the particle converting material 340 at least partially surrounds the inert material. For example, FIG. 8 is a schematic cross-section view of a portion of a light guide 412. All of the design considerations and possibilities regarding the light guide 312 of FIGS. 6-7 apply equally to the light guide 412 of FIG. 8. The light guide 412 can be utilized with any power source, e.g., power source 300 of FIG. 6.

One difference between the light guide 412 of FIG. 8 and light guide 312 of FIG. 7 is that an inert material 402 is disposed within the light guide 412 along a light guide axis 410. Any suitable material or combination materials can be utilized for the inert material 402, e.g., metallic oxides, metallic nitrides, and combinations thereof. Further, the inert material 402 can be disposed in any shape or combination of shapes within the light guide 412. In one or more embodiments, the inert material 402 is disposed such that it is rotationally symmetrical about the light guide axis 410. The inert material 402 can have any thickness in a plane orthogonal to the light guide axis 410. In one or more embodiments, the inert material 402 can be utilized as a filler to reduce cost. Further, in one or more embodiments, the inert material 402 can be utilized to support the other materials of the light guide 412. Radioactive material 430 can be disposed on the inert material 402 in any suitable pattern or patterns. Further, particle converting material 440 can be disposed on at least a portion of the radioactive material 430 in any suitable pattern or patterns. The radioactive material 430 and the particle converting material 440 each can have any suitable thickness in a plane orthogonal to the light guide axis 410.

Figure 9:
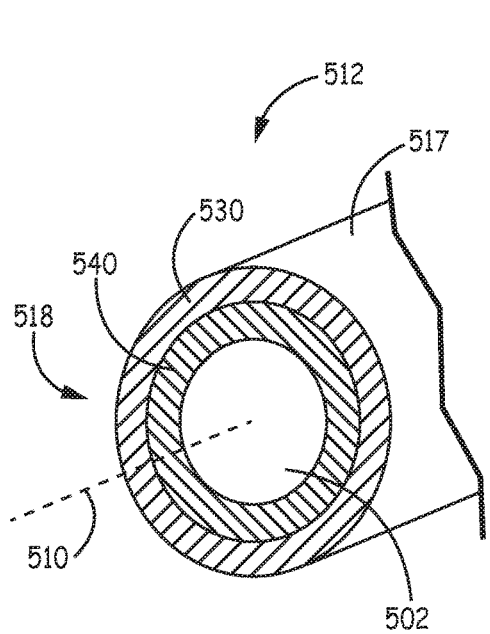
FIG. 9 is a schematic cross-section view of another embodiment of a light guide.

In general, the radioactive material and particle converting material can be disposed on or within the light guide in any suitable pattern or patterns. For example, FIG. 9 is a schematic cross-section view of a portion of another embodiment of a light guide 512. All of the design considerations and possibilities regarding the light guide 300 of FIGS. 6-7 apply equally to the light guide 512 of FIG. 9. The light guide 512 can be utilized with any suitable power source, e.g., power source 300 of FIG. 6.

One difference between the light guide 512 of FIG. 9 and light guide 312 of FIGS. 6-7 is that the light guide 512 includes a waveguide 502 disposed within the light guide along a light guide axis 510. The waveguide 502 can include any suitable material or combination of materials. In one or more embodiments, the waveguide 502 can include a material that is transparent to the electromagnetic radiation emitted by particle converting material 540. The waveguide 502 can take any suitable shape or combination of shapes. In one or more embodiments, the waveguide 502 can have a constant thickness in a plane orthogonal to the light guide axis 510 or a thickness that varies along the light guide axis. Another difference between light guide 512 and light guide 312 is that particle converting material 540 is disposed between the waveguide 502 and radioactive material 530.

The radioactive material 530 can emit one or more radiation particles that are incident upon the particle converting material 540, which converts one or more of these particles into electromagnetic radiation. At least a portion of this electromagnetic radiation can be incident upon the waveguide 502. Electromagnetic radiation incident upon the waveguide 502 within an acceptance angle of the waveguide can be directed into the waveguide, where such radiation can be directed along the light guide axis 510 and through an emitting surface 518 of the light guide 512.

Although not shown, the light guide 512 can include a reflective layer or layers disposed on an outer surface 517 of the light guide to direct one or more radiation particles that are emitted by the radioactive material 530 in a direction away from the light guide axis 510 back into the light guide. Such radiation particles may then be directed to the particle converting material 540, where the material can convert one or more of these particles into electromagnetic radiation. Any suitable material or combination of materials can be utilized to form this reflective layer.

Figure 10:
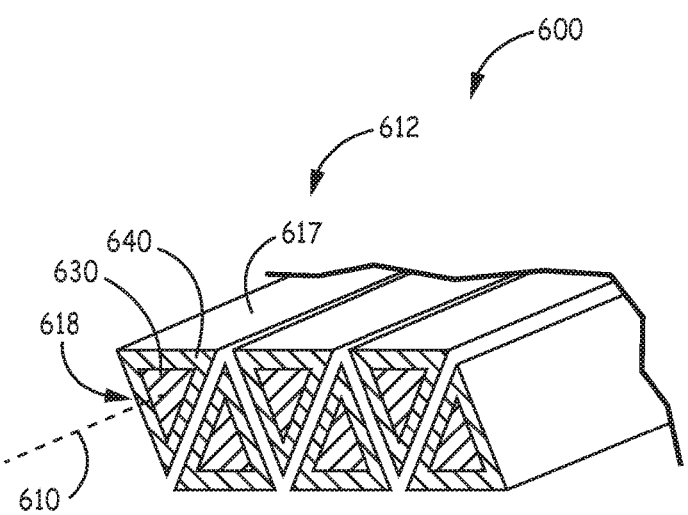
FIG. 10 is a schematic cross-section view of an array of light guides.

The various light guides described herein can take any suitable shape or combination of shapes. Further, the power sources described herein can include any suitable number of light guides. For example, FIG. 10 is a schematic perspective view of a portion of a light guide array 600 that includes a plurality light guides 612. All of the design considerations and possibilities regarding the light guide 312 of FIGS. 6-7 apply equally to each light guide 612 of the array of light guides 600 of FIG. 10. Each light guide 612 of the array 600 can take any suitable shape or combination of shapes and be disposed in any suitable relationship to each other. As illustrated in FIG. 10, each light guide 612 includes a triangular cross-section in a plane orthogonal to its light guide axis 610.

One or more of the light guides 612 can include a radioactive material 630 disposed within the light guide, and a particle converting material 640 also disposed within the light guide. The radioactive material 630 can be disposed such that it is at least partially surrounded or enclosed by the particle converting material 640, e.g., the particle converting material is disposed between the radioactive material and an outer surface 617 of the light guide.

The light guides 612 of the array 600 can be disposed in a suitable relationship relative to each other. In the embodiment illustrated in FIG. 10, the light guides 612 are disposed such that the outer surface 617 of each light guide is disposed adjacent an outer surface of at least one additional light guide, and the light guide axes 610 of the light guides are substantially aligned. In one or more embodiments, the light guides 612 can be closely-packed such that little space remains between each light guide. Further, in one or more embodiments, the light guides 612 can be arranged such that one or more light guides are in contact with another light guide. In one or more embodiments, one or more of the light guides 612 can be spaced apart from an adjacent light guide to provide an air boundary for the light guide such that at least a portion of electromagnetic radiation emitted by the particle converting material 640 is totally internally reflected at the surface boundary and directed along the light guide axis 610.

Radiation particles emitted by the radioactive material 630 can be incident upon the particle converting material 640 such that at least a portion of these radiation particles can be converted to electromagnetic radiation by the particle converting material. At least a portion of the electromagnetic radiation emitted by the particle converting material 640 can be directed along the light guide axis 610 until it is directed through or out of an emitting surface 618 of the light guide 612. Although not shown, electromagnetic radiation directed through the emitting surface 618 can be incident upon an input surface of a photovoltaic device (e.g., input surface 362 of photovoltaic device 360 of power source 300 of FIG. 6), where the device can convert at least a portion of the electromagnetic radiation into electrical energy.

Figure 11:
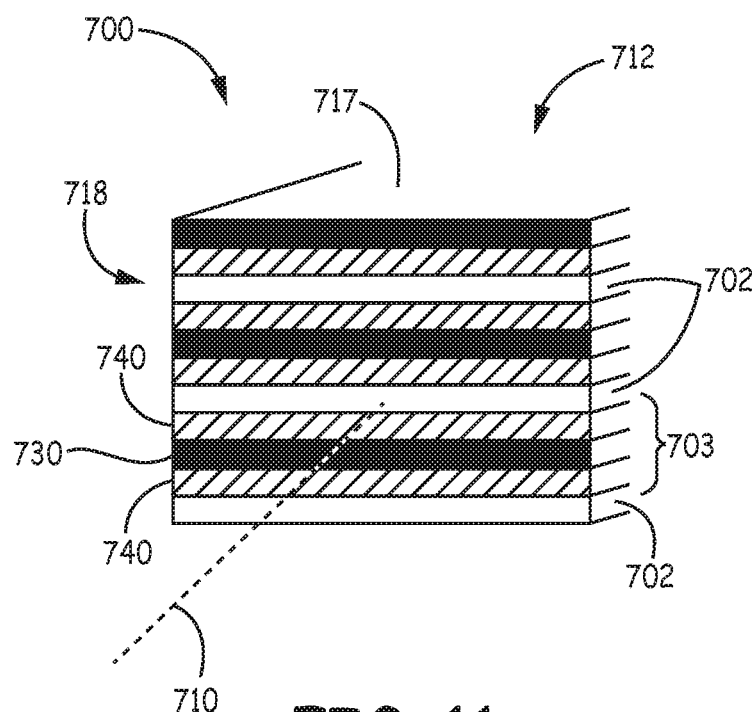
FIG. 11 is a schematic cross-section view of another embodiment of a light guide.

The various light guides described herein can have any suitable cross-sectional shape and be arranged in a suitable array. For example, FIG. 11 is a schematic perspective view of another embodiment of a light guide 712 that can be utilized with a power source (e.g., power source 300 of FIGS. 6-7). All of the design considerations and possibilities regarding the light guide 312 of the power source 300 of FIGS. 6-7 apply equally to the light guide 712 of FIG. 11. One difference between light guide 712 and light guide 312 is that one or more radioactive material layers 730 and one or more particle converting layers 740 are disposed between one or more waveguides 702. The various layers of radioactive material 730, particle converting material 740, and waveguides 702 can be arranged in any suitable order. As illustrated in FIG. 11, the light guide 712 includes one or more triads 703 that includes a single layer of radioactive material 730 disposed between two layers of particle converting material 640. This triad of layers is disposed between two waveguides 702. The light guide 712 can include any suitable member of triads, e.g., one, two, three, or more triads.

Electromagnetic radiation emitted by the particle converting layers 740 can be incident upon one or more of the waveguides 702. Such electromagnetic radiation can be directed by the one or more waveguides 702 along a light guide axis 710 such that it is directed through an emitting surface 718. Electromagnetic radiation that is directed through the emitting surface 718 can be incident upon an input surface of a photovoltaic device (e.g., photovoltaic device 360 of FIG. 6). Although not shown, one or more reflective layers can be disposed on an outer surface 717 of the light guide 712 such that electromagnetic radiation emitted by one or more of the particle converting layers 740 that is incident upon the outer surface can be directed back into the light guide 712, where the electromagnetic radiation can be directed along the light guide axis 710 and through the emitting surface 718. Further, although not shown, the light guide 712 can include a second emitting surface on a second end of the light guide similar to the second emitting surface 319 of the light guide 312.

Figure 12:
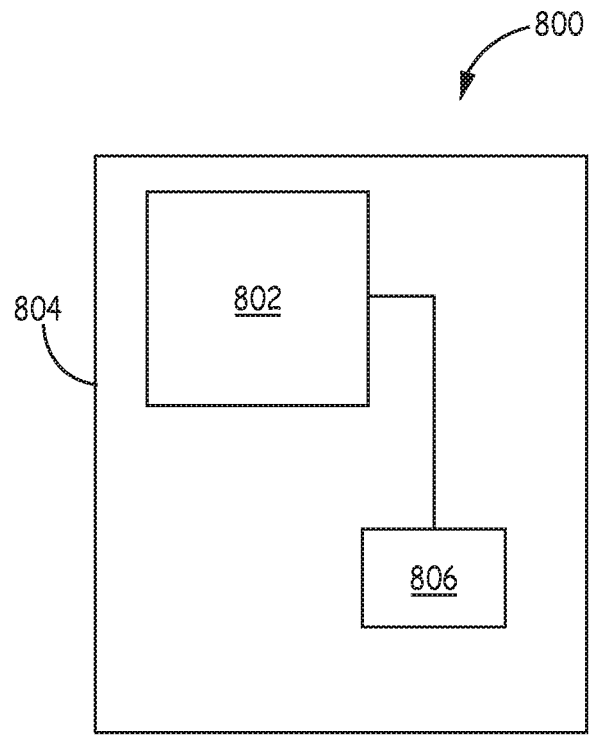
FIG. 12 is a schematic cross-section view of one embodiment of an implantable medical device that includes a power source.

The various embodiments of power sources described herein can be utilized to provide electrical energy to any suitable electronic devices or circuitry. For example, FIG. 12 is a schematic cross-section view of one embodiment of an implantable medical device 800. The implantable medical device 800 can include a power source 802 disposed within a housing 804 of the device. Any suitable power source or combination of power sources can be disposed within the housing 804, e.g., power source 10 of FIGS. 1-2. The power source 802 can be electrically connected to one or more electronic devices 806 disposed within the housing 804. The one or more electronic devices 806 can include any suitable devices, components, or circuitry, e.g., ECG sensors, EKG sensors, glucose sensors, chemical sensors, biomarker sensors, power/voltage converters (e.g., stepping up or down voltage), accumulators (e.g., to store energy to be used for peak power demands, such as telemetry or therapy), electrocardiogram (ECG) monitors, implantable pulse generators (IPGs) (e.g., pacemakers), implantable cardioverter defibrillators (ICDs), etc.

Figure 13:
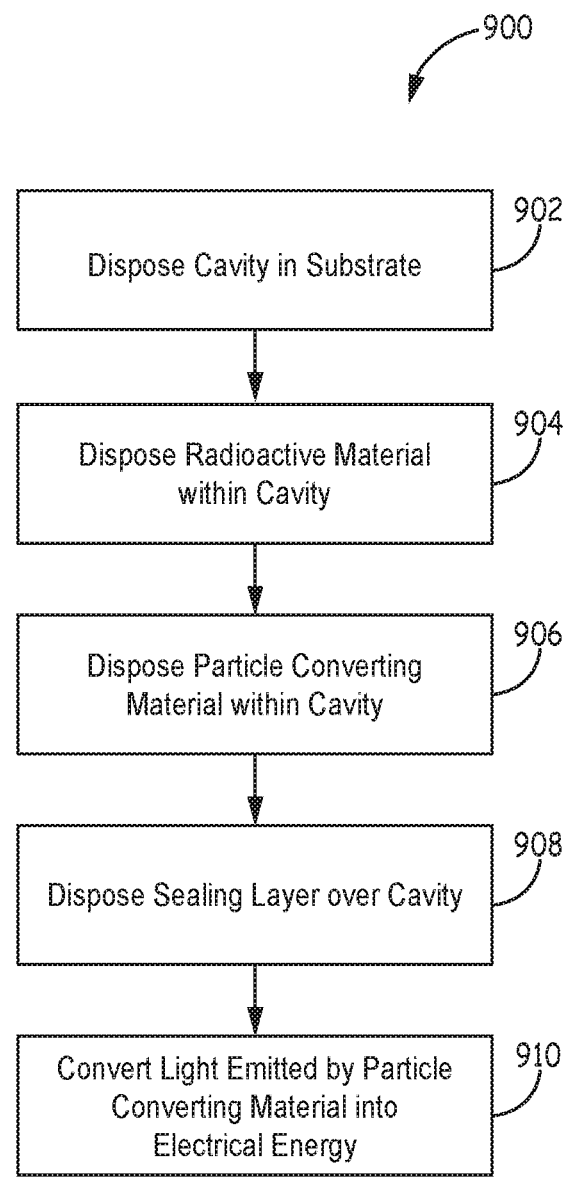
FIG. 13 is a flowchart of one embodiment of a method of forming a power source.

As described herein, any suitable technique or combination of techniques can be utilized to form one or more of the various embodiments of power sources described herein. For example, FIG. 13 is a flowchart of one method 900 of forming a power source. Although method 900 can be utilized to form any suitable power source, the method will be described in regard to power source 10 of FIGS. 1-2. At 902, the cavity 20 can be disposed in the substrate 12, e.g., in the first major surface 14. Radioactive material 30 can be disposed within the cavity 20 using any suitable technique or combination of techniques at 904. In one or more embodiments, a carrier material can be disposed within the cavity 20, and the carrier material can be exposed to radioactive gas to form the radioactive material 30. Particle converting material 40 can be disposed within the cavity 20 using any suitable technique or combination of techniques at 906. In one or more embodiments, the particle converting material 40 is disposed on at least a portion of the radioactive material 30. At 908, the sealing layer 50 can be disposed over the cavity 20. In one or more embodiments, the sealing layer 50 can be disposed over the cavity 20 such that the radioactive material 30 and the particle converting material 40 are sealed (e.g., hermetically sealed) within the cavity 20. Electromagnetic radiation, e.g., light, emitted by the particle converting material 40 can be converted into electrical energy at 910 using any suitable technique or combination of techniques. For example, in one or more embodiments, the photovoltaic device 60 can convert light emitted by the particle converting material 40 into electrical energy.

All references and publications cited herein are expressly incorporated herein by reference in their entirety into this disclosure, except to the extent they may directly contradict this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. A power source, comprising:
    a substrate comprising a structured surface;
    radioactive material disposed on the structured surface, wherein the radioactive material emits radiation particles;
    particle converting material disposed on at least a portion of the radioactive material, wherein the particle converting material converts one or more radiation particles emitted by the radioactive material into light;
    a sealing layer disposed on the structured surface such that the particle converting material and the radioactive material are hermetically sealed between the sealing layer and the structured surface; and
    a photovoltaic device disposed directly adjacent the structured surface of the substrate, wherein the photovoltaic device converts at least a portion of the light emitted by the particle converting material that is incident upon an input surface of the photovoltaic device into electrical energy.

2. The power source of claim 1, wherein the radioactive material comprises tritium.

3. The power source of claim 1, wherein the particle converting material comprises phosphor.

4. The power source of claim 1, wherein the particle converting material comprises quantum dots.

5. The power source of claim 1, wherein the substrate comprises glass.

6. The power source of claim 1, wherein the photovoltaic device comprises a photodiode.

7. The power source of claim 1, wherein the substrate further comprises a reflective layer disposed between the substrate and the particle converting material.

8. The power source of claim 1, wherein the substrate further comprises an anti-diffusion layer disposed between the radioactive material and the substrate.

9. The power source of claim 1, further comprising an antireflective layer disposed between the sealing layer and the input surface of the photovoltaic device.

10. The power source of claim 1, wherein the input surface of the photovoltaic device is disposed on the sealing layer.

11. The power source of claim 1, wherein the substrate comprises a first major surface and a second major surface, wherein the first major surface comprises the structured surface, the power source further comprising a reflector disposed adjacent the second major surface of the substrate such that the reflector faces the photovoltaic device.

12. The power source of claim 1, wherein the sealing layer includes one or more structures that are registered with the structured surface.

13. The power source of claim 1, wherein the structured surface has a cross-sectional shape in a plane parallel to the structured surface.

14. The power source of claim 1, wherein the structured surface has a cross-sectional shape in a plane orthogonal to the structured surface.

15. The power source of claim 1, wherein the structured surface comprises structures arranged in one or more of a periodic array on or in the structured surface, a random arrangement on or in the structured surface, or a pseudo-random arrangement on or in the structured surface.

16. The power source of claim 1, wherein the particle converting material is disposed on the at least a portion of the radioactive material in at least one pattern.

17. The power source of claim 1, wherein the sealing layer is disposed on and in contact with the particle converting material layer.

18. The power source of claim 17, wherein the sealing layer conforms to the shape of the particle converting material layer.

19. An implantable medical device comprising the power source of claim 1.

* * * * *